(12) United States Patent
Tan et al.

(10) Patent No.: US 11,386,040 B2
(45) Date of Patent: Jul. 12, 2022

(54) CIRCUIT UNIT, CIRCUIT MODULE AND APPARATUS FOR DATA STATISTICS

(71) Applicant: NANJING HORIZON ROBOTICS TECHNOLOGY CO., LTD., Nanjing (CN)

(72) Inventors: Honghe Tan, Beijing (CN); Nan Meng, Beijing (CN)

(73) Assignee: NANJING HORIZON ROBOTICS TECHNOLOGY CO., LTD., Nanjing (CN)

( * ) Notice: Subject to any disclaimer, the term of this patent is extended or adjusted under 35 U.S.C. 154(b) by 873 days.

(21) Appl. No.: 16/229,610

(22) Filed: Dec. 21, 2018

(65) Prior Publication Data

US 2019/0205286 A1 Jul. 4, 2019

(30) Foreign Application Priority Data

Dec. 29, 2017 (CN) .......................... 201711474618.1

(51) Int. Cl.
*G06F 5/10* (2006.01)
*G06F 7/02* (2006.01)
(Continued)

(52) U.S. Cl.
CPC .............. *G06F 15/825* (2013.01); *G06F 5/10* (2013.01); *G06F 7/02* (2013.01); *G06T 1/20* (2013.01);
(Continued)

(58) Field of Classification Search
None
See application file for complete search history.

(56) References Cited

U.S. PATENT DOCUMENTS 6,157,209 A 12/2000 McGettigan
6,157,695 A 12/2000 Barna
(Continued)

FOREIGN PATENT DOCUMENTS

CN 1287715 A 3/2001
CN 1442797 A 9/2003
(Continued)

OTHER PUBLICATIONS

Office Action from corresponding Korean Application No. 2018-0172369 dated Mar. 17, 2020.
(Continued)

*Primary Examiner* — Anh Q Tran
(74) *Attorney, Agent, or Firm* — Lando & Anastasi, LLP

(57) ABSTRACT

Disclosed are a circuit unit, a circuit module and an apparatus for data statistics. The circuit unit comprises a first register and a second register, and stores data received via a first input terminal in the first register in a case where a first control terminal receives a valid control signal, stores data received via a second input terminal in the second register in a case where a second control terminal receives a valid control signal, and increases the value of data stored in the second register by 1 in a case where a third control terminal receives a valid control signal. The circuit module comprises one or more such circuit units, and the apparatus comprises one or more such circuit modules. The circuit module or the apparatus may use smaller resource and smaller power consumption to complete data statistics.

20 Claims, 6 Drawing Sheets

(51) Int. Cl.
*G11C 7/10* (2006.01)
*G06F 15/82* (2006.01)
*G06T 1/20* (2006.01)
*H03K 21/02* (2006.01)
*H03K 21/16* (2006.01)
*H03K 19/173* (2006.01)
*G06F 9/30* (2018.01)
*H03K 5/13* (2014.01)
*H03K 19/17736* (2020.01)

(52) U.S. Cl.
CPC ......... *G11C 7/1078* (2013.01); *H03K 21/026* (2013.01); *H03K 21/16* (2013.01); *G06F 9/30105* (2013.01); *H03K 5/13* (2013.01); *H03K 19/1737* (2013.01); *H03K 19/17736* (2013.01)

(56) References Cited

U.S. PATENT DOCUMENTS

| | | | |
|---|---|---|---|
| 6,512,775 | B1 | 1/2003 | Eleftheriades et al. |
| 8,111,916 | B2 | 2/2012 | Chao et al. |
| 2004/0010321 | A1 | 1/2004 | Morishita et al. |
| 2008/0092002 | A1* | 4/2008 | Shimooka ...... G01R 31/318536 714/E11.155 |
| 2009/0224799 | A1* | 9/2009 | Ogawa ............. H03K 19/17748 326/38 |
| 2012/0030453 | A1* | 2/2012 | Ito ....................... G06F 15/8015 712/E9.045 |
| 2016/0103680 | A1 | 4/2016 | Tanaka |

FOREIGN PATENT DOCUMENTS

| | | |
|---|---|---|
| CN | 105512092 A | 4/2016 |
| CN | 107248136 A | 10/2017 |
| JP | H0852560 A | 2/1996 |
| JP | H10240496 A | 9/1998 |
| JP | 2010226253 A | 10/2010 |
| JP | 2012033112 A | 2/2012 |
| JP | 2017162201 A | 9/2017 |

OTHER PUBLICATIONS

Wen et al., "Electrical Technology & Electrical Engineering," Jul. 31, 2010, pp. 160-166.

Extended European Search Report from corresponding European Application No. 18248207.5 dated Apr. 26, 2019.

Tocci et al., "Chapter 7: Counters and Registers", Digital Systems Principles and Applications Tenth Edition Education International, Jan. 2007, Pearson, pp. 360-484.

* cited by examiner

US 11,386,040 B2

CIRCUIT UNIT, CIRCUIT MODULE AND APPARATUS FOR DATA STATISTICS

CROSS-REFERENCE TO RELATED APPLICATION

This application claims priority to Chinese Application No. 201711474618.1, filed Dec. 29, 2017, titled "CIRCUIT UNIT, CIRCUIT MODULE AND APPARATUS FOR DATA STATISTICS."

TECHNICAL FIELD OF THE DISCLOSURE

The present disclosure generally relates to technical field of data statistics, and more particularly, to a circuit unit, a circuit module and an apparatus for data statistics.

BACKGROUND

In many applications, an input data stream needs to be counted to obtain some specific statistical information. For example, during processing of image data, it may be necessary to perform statistics on the data stream of the input image to obtain, for example, local luminance information, holographic histogram information, etc.

It is desired that the data statistics may be efficiently realized by using hardware with low consumption.

SUMMARY

In one aspect, disclosed is a circuit unit for data statistics. The circuit unit may comprise a first subcircuit and a second subcircuit. The first subcircuit may comprise a first register and may be configured to store data received via a first input terminal of the circuit unit in the first register in a case where a first control terminal of the circuit unit receives a first valid control signal. An output terminal of the first register may be coupled to a first output terminal of the circuit unit. The second subcircuit may comprise a second register, and may be configured to store data received via a second input terminal of the circuit unit in the second register in a case where a second control terminal of the circuit unit receives a second valid control signal. The second subcircuit may also be configured to increase the value of data stored in the second register by 1 in a case where a third control terminal of the circuit unit receives a third valid control signal. An output terminal of the second register may be coupled to a second output terminal of the circuit unit.

In another aspect, disclosed is also a circuit module for data statistics. The circuit module may comprise one or more abovementioned circuit units, wherein the one or more circuit units may include a first circuit unit, the first input terminal and the second input terminal of the first circuit unit receive input data and an initial counting value respectively via a first input terminal and a second input terminal of the circuit module. The circuit module may also comprise a control logic circuit. The control logic circuit may be configured to determine whether data in the first register of each circuit unit is the same as the input data and whether data in the second register of each circuit unit is equal to 0. The control logic circuit may also be configured to correspondingly provide a first control signal, a second control signal and a third control signal to each circuit unit according to the result of determination, and selectively output data in the first register and the second register of one of the one or more circuit units respectively via a first output terminal and a second output terminal of the circuit module.

In another aspect, disclosed is also an apparatus for data statistics. The apparatus may comprise one or more abovementioned circuit modules, wherein the one or more circuit modules may comprise a first circuit module, the first input terminal and the second input terminal of the first circuit module may respectively receive parsed data and a constant value 1. The apparatus may also comprise an update circuit. The update circuit may be coupled between a last circuit module of the one or more circuit modules and a memory, and is configured to update information in the memory based on a data item from the first output terminal of the last circuit module and a statistic value from the second output terminal of the last circuit module, wherein the first circuit module is used as the last circuit module in a case where the one or more circuit modules are one circuit module; a plurality of circuit modules may be connected in series in a case where the one or more circuit modules are a plurality of circuit modules, such that the first input terminal and the second input terminal of each circuit module except for the first circuit module are respectively coupled to the first output terminal and the second output terminal of the previous circuit module, meanwhile, the first output terminal and the second output terminal of each circuit module except for the second circuit module are respectively coupled to the first input terminal and the second input terminal of a subsequent circuit module, wherein the second circuit module is used as the last circuit module.

The circuit unit, the circuit module and/or the apparatus according to an embodiment of the present disclosure may use less resources and power consumption to complete data statistics.

DETAILED DESCRIPTION

Details of a circuit unit, a circuit module, and an apparatus according to an embodiment of the present disclosure are described below in conjunction with the drawings. In various figures, arrows may represent directions in which data are transmitted, and the same reference numbers may be used to represent the same or similar elements or components, and the number 1 or 0 may have different meanings depending on the circumstances.

Figure 1:
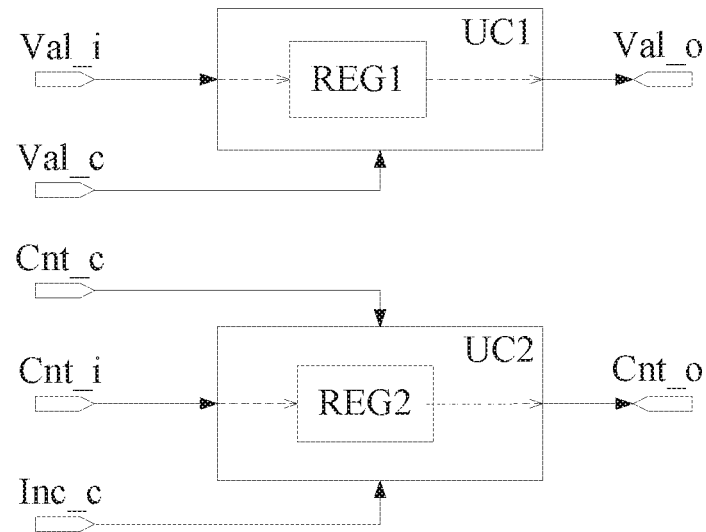
FIG. 1 schematically shows a circuit unit for data statistics according to an embodiment of the present disclosure.

As shown in FIG. 1, a circuit unit for data statistics according to an embodiment of the present disclosure may have input terminals Val_i and Cnt_i, output terminals Val_o and Cnt_o, and control terminals Val_c, Cnt_c, and Inc_c, and may comprise a subcircuit UC1 and a subcircuit UC2.

The subcircuit UC1 may comprise a register REG1. The register REG1 may store data input via the input terminal Val_i and may output the stored data via the output terminal Val_o. In one embodiment, the subcircuit UC1 may be configured to store data input via the input terminal Val_i into the register REG1 in a case where the control terminal Val_c receives a valid control signal.

The subcircuit UC2 may comprise a register REG2. The register REG2 may store data input via the input terminal Cnt_i and may output the stored data via the output terminal Cnt_o. In one embodiment, the subcircuit UC2 may be configured to store data input via the input terminal Cnt_i into the register REG2 in a case where the control terminal Cnt_c receives a valid control signal. The subcircuit UC2 may also be configured to add 1 to the value of the data stored in the register REG2 in a case where the control terminal Inc_c receives a valid control signal.

A valid control signal may also be called as an enable signal, i.e. a signal that enables an element or component or hardware module or apparatus to start to work or to convert to a valid state. For example, an element or component starts to work or converts to a valid state in a case where it receives a high-level signal, then the high-level signal may be used as an enable signal or a valid control signal for the element or component. In another example, as needed, the valid signal may also be other forms of signals such as a low-level signal, a signal at a certain potential or having a certain voltage value, a signal having a particular frequency, and the like. A binary 1 is also used to represent a valid control signal or enable signal, and correspondingly, a binary 0 may represent an invalid control signal or an inhibiting signal.

Figure 2:
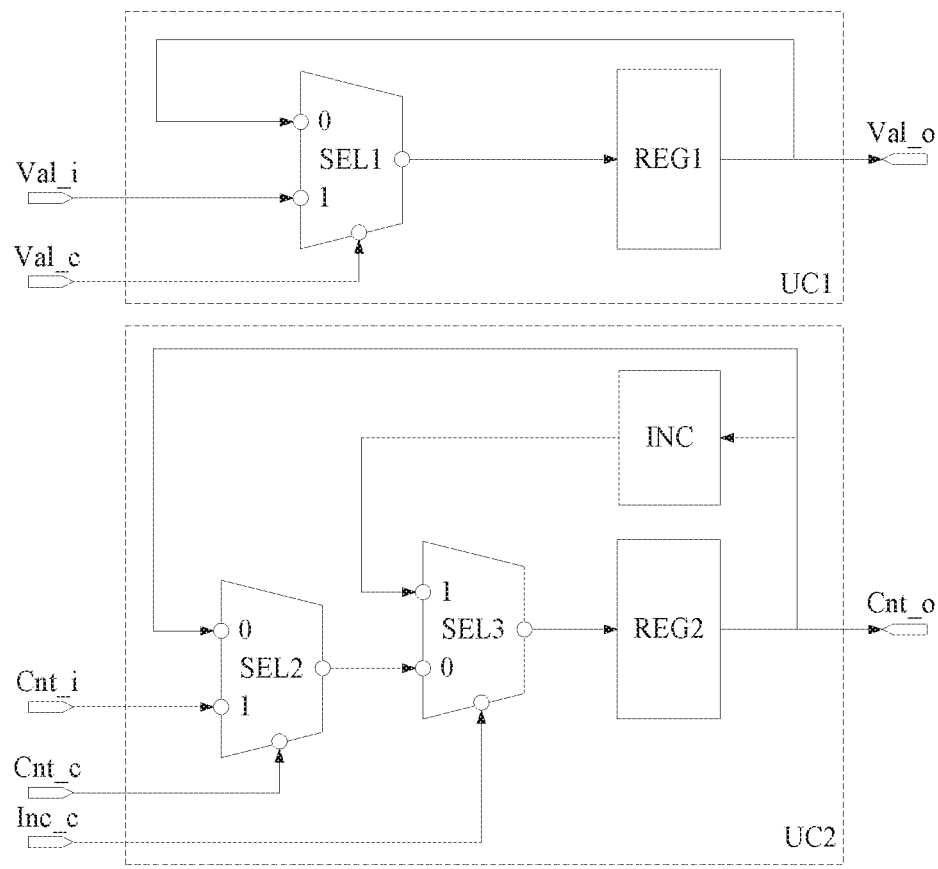
FIG. 2 schematically shows an example of a circuit structure of a circuit unit for data statistics according to an embodiment of the present disclosure.

In an embodiment, as shown in FIG. 2, the subcircuit UC1 may further comprise a selector SEL1. For example, the selector SEL1 may be an alternative type of multiplexer (or multi-way switch), and may have a control terminal, an input terminal corresponding to a valid control signal (represented by 1 in FIG. 2, and also referred to as input terminal 1 for short), and an input terminal corresponding to an invalid control signal (represented by 0 in FIG. 2, and also referred to as input terminal 0 for short). The control terminal, the input terminal 1, the input terminal 0 and an output terminal of the selector SEL1 may be respectively coupled to the control terminal Val_c, the input terminal Val_i, the output terminal of REG1, and the input terminal of REG1.

The selector SEL1 may output data received via the input terminal 1 in a case where the control terminal receives a valid control signal, otherwise, output data received via the input terminal 0. Thus, the subcircuit UC1 may replace the old data in the register REG1 with new data received via Val_i and output the new data at the output terminal Val_o in a case where the control terminal Val_c receives a valid control signal, otherwise, output the original old data at the output terminal Val_o.

In another embodiment, the selector SEL1 may also be a switch (e.g., an electronic switch realized by a transistor, etc.) with an input terminal, a control terminal and an output terminal, and the switch may turn on the input terminal and the output terminal in a case where the corresponding control terminal receives a valid control signal, otherwise, turn off the connection between the input terminal and the output terminal. The input terminal, the output terminal and the control terminal of the switch may be respectively coupled to the input terminal Val_i, the input terminal of the register REG1 and the control terminal Val_c, and the output terminal of the register REG1 may not be necessary to be coupled to the switch.

In another embodiment, the selector SEL1 may also be a combination of one or more logic gate elements which may realize the same function. In one embodiment, the selector SEL1 may be a portion of the input control circuit of register REG1.

In an embodiment, as shown in FIG. 2, the subcircuit UC2 may further comprise selectors SEL2, SEL3 and an accumulator INC.

Similar to the selector SEL1 of the subcircuit UC1, the selectors SEL2 and SEL3 may be alternative type of multiplexers (or multi-way switches) too. An input terminal 1, an input terminal 0, a control terminal and an output terminal of the selector SEL2 may be respectively coupled to the input terminal Cnt_i, the output terminal of the register REG2, the control terminal Cnt_c and an input terminal 0 of the selector SEL3. An input terminal 1, the input terminal 0, a control terminal and an output terminal of the selector SEL3 may be respectively coupled to an output terminal of the accumulator INC, the output terminal of the selector SEL2, the control terminal Inc_c and the input terminal of the register REG2, and an input terminal of the accumulator INC may be coupled to the output terminal of the register REG2.

Similar to the selector SEL1 in the subcircuit UC1, the selectors SEL2 and SEL3 may output data received via the corresponding input terminal 1 in a case where the corresponding control terminal receives a valid control signal, otherwise, output data received via the corresponding input terminal 0. The accumulator INC is used to add 1 to the data in the register REG2, and provides the data values obtained after adding 1 to the input terminal 1 of the selector SEL3. Thus, the working process of the subcircuit UC2 may be shown in the following Table 1, (assuming that the old data previously stored in the register REG2 is CNT1, and the new data received via input Cnt_i is CNT2):

TABLE 1

| Signal at control terminal Cnt_c | Signal at control terminal Inc_c | Data output by selector SEL2 | Data output by selector SEL3 | Data in register REG2 |
|---|---|---|---|---|
| Invalid | Invalid | CNT1 | CNT1 | CNT1 |
| Valid | Invalid | CNT2 | CNT2 | CNT2 |
| Invalid | Valid | CNT1 | CNT1 + 1 | CNT1 + 1 |
| Valid | Valid | CNT2 | CNT1 + 1 | CNT1 + 1 |

That is to say, the subcircuit UC2 may maintain the data in the register REG2 unchanged in a case where the control signal received via the control terminal Cnt_c is invalid and the control signal received via the control terminal Inc_c is invalid, and output the old data CNT1 maintained in the register REG2 at the output terminal Cnt_o. The subcircuit UC2 may replace the old data in the register REG2 with new data received via the input terminal Cnt_i in a case where the control signal received via the control terminal Cnt_c is valid and the control signal received via the control terminal Inc_c is invalid, and output the new data CNT2 in the register REG2 at the output terminal Cnt_o. The subcircuit UC2 may add 1 to the value of the data in the register REG2 in a case where the control signal received via the control terminal Inc_c is valid, and output the new data CNT1+1 in the register REG2 at the output terminal Cnt_o.

In another embodiment, the selector SEL2 may also be a switch (e.g., an electronic switch realized by a transistor, etc.) with an input terminal, a control terminal and an output terminal, and the switch may turn on the input terminal and the output terminal in a case where the corresponding control terminal receives a valid control signal, otherwise, turn off the connection between the input terminal and the output terminal. In this embodiment, the selector SEL2 may also be called as a switch SEL2, whose input terminal, output terminal and control terminal may be respectively coupled to the input terminal Cnt_i, the input terminal 0 of the selector SEL3, and the control terminal Cnt_c, and the output terminal of the register REG2 may not be necessary to be coupled to the switch SEL2.

Further, the selector SEL3 may be a switch (e.g., an electronic switch realized by a transistor, etc.) with an input terminal, a control terminal and an output terminal too, and the switch may turn on the input terminal and the output terminal in a case where the corresponding control terminal receives a valid control signal, otherwise, turn off the connection between the input terminal and the output terminal. In this embodiment, the selector SEL3 may also be called as a switch SEL3, whose input terminal, output terminal and control terminal may be respectively coupled to the output terminal of the accumulator INC, the input terminal of the register REG2, and the control terminal Inc_c, and accordingly, the output terminal of the selector SEL2 or the switch SEL2 may be coupled to the register REG2. In this embodiment, it is possible to control the control signal received via the control terminal Cnt_c and the control signal received via the control terminal Inc_c not to be valid at the same time to avoid collision.

In another embodiment, the selectors SEL2 and/or SEL3 may also be a combination of one or more logic gate elements which may realize the same function. In one embodiment, the selector SEL2 and/or the selector SEL3 and/or the accumulator INC may be a portion of the input control circuit of register REG2.

In another embodiment, an additional selector or switch may be set between the register REG1 and the output terminal Val_o and/or between the register REG2 and the output terminal Cnt_o in the subcircuits UC1 and/or UC2, to control whether the data in the register are output at the output terminal Val_o and/or the output terminal Cnt_o.

Figure 3:
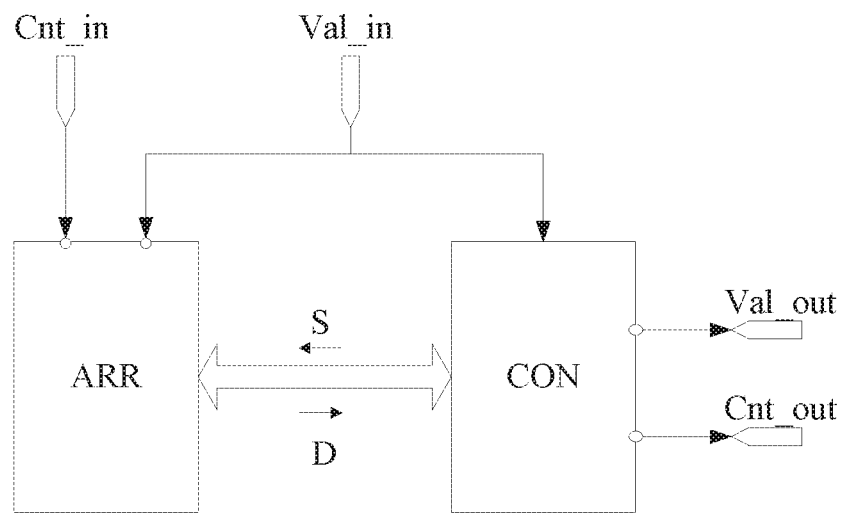
FIG. 3 schematically shows a circuit module for data statistics according to an embodiment of the present disclosure.

FIG. 3 shows an example of a circuit module for data statistics according to an embodiment of the disclosure. As shown in FIG. 3, a circuit module for data statistics according to the disclosed embodiment may have input terminals Cnt_in and Val_in and output terminals Val_out and Cnt_out, and may comprise a statistical circuit array ARR. The statistical circuit array ARR may comprise one or more circuit units as shown in FIG. 1 or FIG. 2.

As shown in FIG. 3, the circuit module may further comprise a control logic circuit CON. The control logic circuit CON may be coupled to each circuit unit in the statistical circuit array ARR, and may receive data (D) from the output terminals Val_o and/or Cnt_o of each circuit unit in the statistical circuit array ARR, and may provide corresponding control signals (S) to the control terminals Val_c, Cnt_c and Inc_c of each circuit unit in the statistical circuit array ARR.

The control logic circuit may be configured to determine whether the data in the register REG1 of each circuit unit in the statistical circuit array ARR is the same as the data received via the input terminal Val_in and whether the data in the register REG2 of each circuit unit is equal to 0, and provide corresponding control signals to the control terminals Val_c, Cnt_c and/or Inc_c of each circuit unit in the statistical circuit array ARR according to the result of the determination. In addition, the control logic circuit may be further configured to selectively output the data in the register REG1 and the register REG2 of one circuit unit in the statistical circuit arrays ARR via the output terminal Val_out and the output terminal Cnt_out, respectively.

Figure 4:
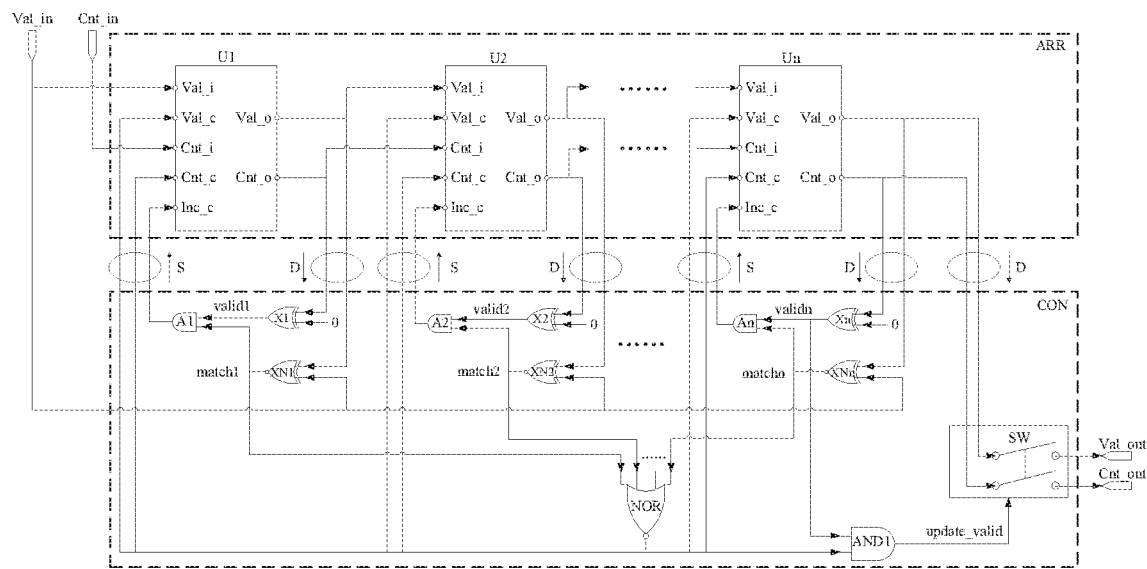
FIG. 4 schematically shows an example of a circuit structure of a circuit module for data statistics according to an embodiment of the present disclosure.
Figure 5:
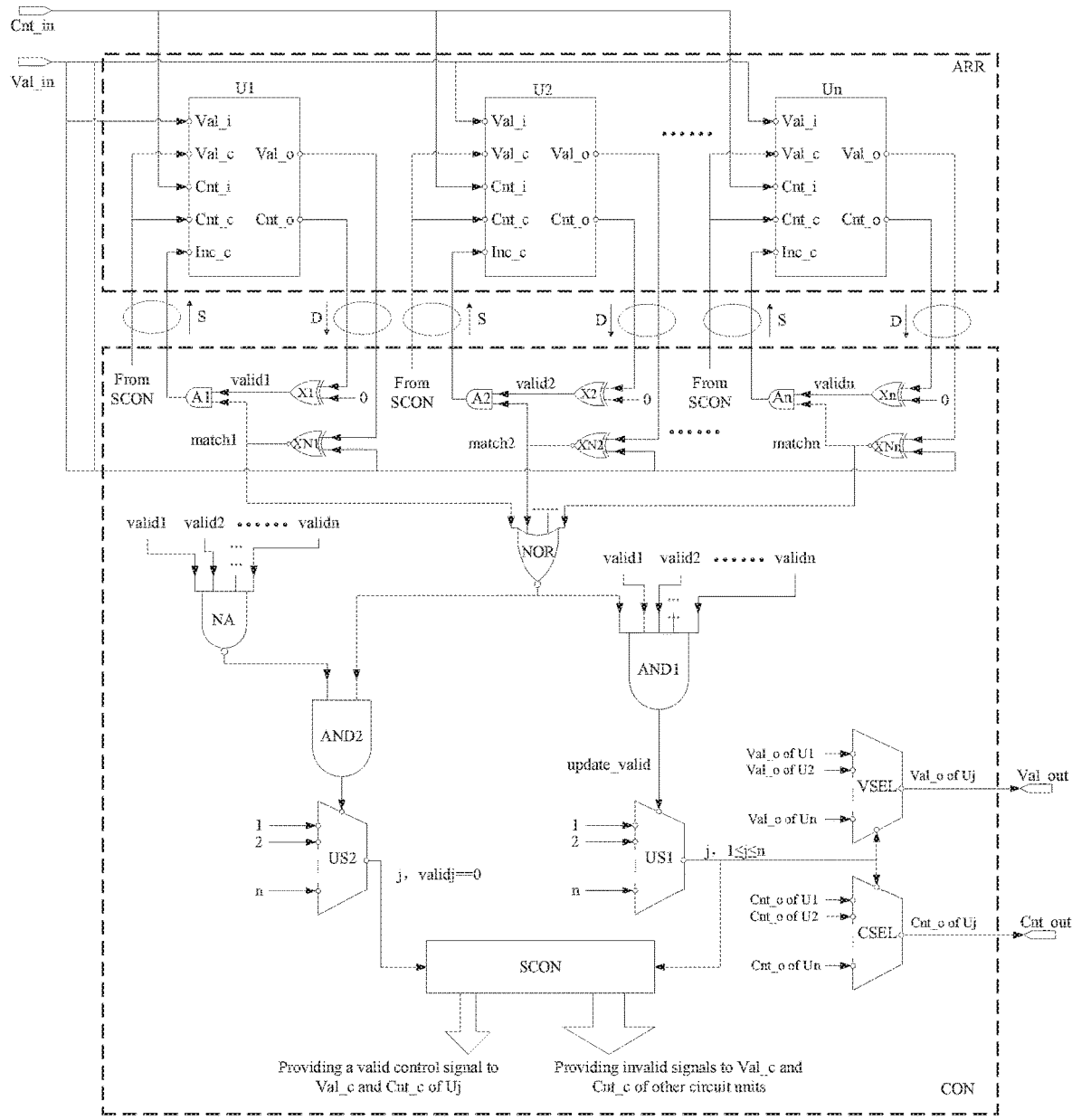
FIG. 5 schematically shows another example of a circuit structure of a circuit module for data statistics according to an embodiment of the present disclosure.
Figure 6:
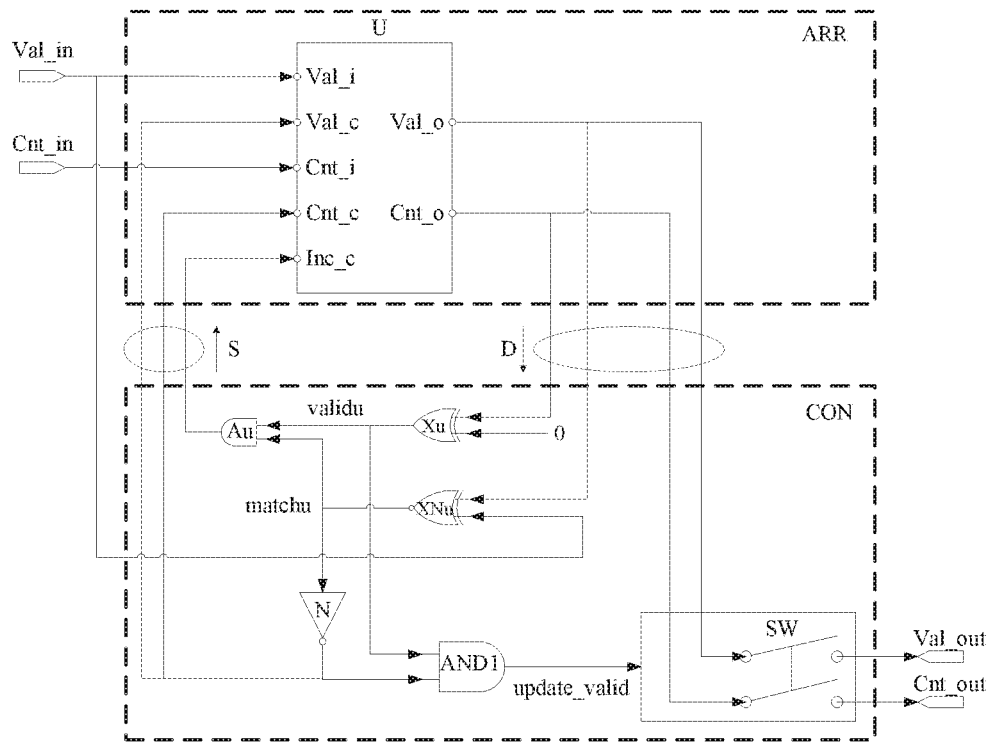
FIG. 6 schematically shows still another example of a circuit structure of a circuit module for data statistics according to an embodiment of the present disclosure.

FIG. 4 to FIG. 6 show different examples of a circuit module according to an embodiment of the present disclosure.

In the example of FIG. 4, the statistical circuit array ARR may comprise a plurality of circuit units U1 to Un connected in series, wherein the input terminals Val_i and Cnt_i of the circuit unit U1 are respectively coupled to the input terminals Val_in and Cnt_in of the circuit module, and the input terminals Val_i and Cnt_i of each circuit unit except for the circuit unit U1 are respectively coupled to the output terminals Val_o and Cnt_o of the corresponding previous circuit unit, meanwhile the output terminals Val_o and Cnt_o of each circuit unit except for the circuit unit Un are respectively coupled to the input terminals Val_i and Cnt_i of the corresponding subsequent circuit unit. For example, the input terminals Val_i and Cnt_i of the circuit unit U2 are respectively coupled to the output terminals Val_o and Cnt_o of the circuit unit U1.

As shown in FIG. 4, in an embodiment, the control logic circuit CON may comprise a comparator Xk and a comparator XNk respectively corresponding to each circuit unit Uk, wherein $1 \leq k \leq n$. For example, corresponding to the circuit unit U1, the control logic circuit CON may comprise a comparator X1 and a comparator XN1; corresponding to the circuit unit U2, the control logic circuit CON may comprise a comparator X2 and a comparator XN2; corresponding to the circuit unit Un, the control logic circuit CON may comprise a comparator Xn and a comparator XNn.

In an embodiment, two input terminals of the comparator XNk may be respectively coupled to the output terminal Val_o of the circuit unit Uk and the input terminal Val_in of the circuit module, so as to compare the data in the register REG1 of the circuit unit Uk and the data received by the circuit module via the input terminal Val_in. In a case where the two data being compared are identical, the comparator XNk may output a message or signal indicating that the two data being compared are the same, otherwise, the comparator XNk may output a message or signal indicating that the two data being compared are different. For example, the comparator XNk may output a signal matchk, which may be a valid signal (e.g., a high level or any other forms that may represent a binary 1) in a case where the two data being compared are identical, and which may be an invalid signal (e.g., a low level or any other forms that may represent a binary 0) in a case where the two data being compared are different.

As shown in FIG. 4, the two input terminals of the comparator XN1 may be respectively coupled to the output terminal Val_o of the circuit unit U1 and the input terminal Val_in of the circuit module, and the output signal or message match1 may be 1 in a case where the data in the register REG1 of the circuit unit U1 is the same as the data received via the input terminal Val_in, otherwise 0.

Although an XNOR gate element is used in FIG. 4 to represent the comparator XNk, this does not mean that the comparator XNk must be realized by only one XNOR gate element. In various embodiments, the comparator XNk may comprise one or more logic gate elements, or may comprise an integrated value comparator such as CC14585 or 74LS85, as needed.

For example, the comparator XNk may comprise a plurality of XNOR gate elements and an AND gate element, wherein each XNOR gate element may have two input terminals and respectively receive one bit in binary representations of the data in the register REG1 in the circuit unit Uk and a corresponding one bit in binary representations of the data received via the input Val_in. Then, the output terminal of each XNOR gate element may be respectively coupled to an input terminal of the AND gate element.

One input terminal of the comparator Xk may be coupled to the output terminal Cnt_o of the circuit unit Uk, and the other input terminal may receive a constant value 0, so as to compare the data in the register REG2 of the circuit unit Uk and 0. In a case where the two data being compared are the same, the comparator Xk may output a message or signal indicating that the two data being compared are the same, otherwise, the comparator Xk may output a message or signal indicating that the two data being compared are different. For example, the comparator Xk may output a signal validk which may be a valid signal (e.g., a high level or any other forms that may represent a binary 1) in a case where the two data being compared are different, and which may be an invalid signal (e.g., a low level or any other forms that may represent a binary 0) in a case where the two data being compared are the same.

As shown in FIG. 4, one input terminal of the comparator X1 may be coupled to the output terminal Cnt_o of the circuit unit U1, and the other input terminal receives a constant value 0, and the output signal or message valid1 may represent a binary 1 in a case where the data in the register REG2 of the circuit unit U1 is not equal to 0, otherwise representing a binary 0.

Although an XOR gate element is used in FIG. 4 to represent the comparator Xk, this does not mean that the comparator Xk must be realized by only one XOR gate element. In various embodiments, the comparator Xk may comprise one or more logic gate elements, or may include an integrated value comparator such as CC14585 or 74LS85, as needed.

For example, the comparator Xk may also be set with an input terminal which is coupled to the output terminal Cnt_o of the circuit unit Uk. Further, the comparator Xk may comprise one or more OR gate elements, to perform a logical OR operation on the binary number of all bits of the data in the register REG2 of the circuit unit Uk, and output the result of the logical OR operation as a signal or message validk. For example, in a case where the register REG2 of the circuit unit Uk is a 32-bit register and the stored data is 3, then, 2 binary 1 are included in the 32 binary bits of the binary representation of the value 3, and the result of performing a logical OR operation on all 32-bit binary numbers is 1, accordingly, the signal or message validk output by the comparator Xk may be 1. The number of OR gate elements may depend on the number of bits of register REG2 of circuit unit Uk, the used number of input terminal of the OR gate elements and the arrangement manner of the OR gate elements.

As shown in FIG. 4, the output terminals of each pair of comparators Xk and XNk may also be coupled to two input terminals of detector Ak, respectively, and the output terminal of detector Ak is coupled to the control terminal Inc_c of the circuit unit Uk. For example, the output terminals of the comparators X1 and XN1 may also be coupled to the two input terminals of the detector A1, respectively, and the output terminal of the detector A1 is coupled to the control terminal Inc_c of the circuit unit U1. In the example of FIG. 4, the detector Ak contains an AND gate element.

In another embodiment, the detector Ak may comprise an integrated value comparator such as CC14585 or 74LS85. In this embodiment, the detector Ak may provide a valid control signal to the control terminal Inc_c of the circuit unit Uk in a case where the received two data are the same or both are greater than 0, thereby realizing a function equivalent to the AND gate element.

In another embodiment, the detector Ak may comprise, for example, an alternative type of multiplexer (or multi-way switch). For example, the output terminal of the comparator Xk may be coupled to the control terminal of Ak, the output terminal of the comparator XNk may be coupled to the input terminal of Ak corresponding to the valid control signal, a 0 may be provided to an input terminal of Ak corresponding to an invalid control signal, and an output terminal of Ak may be coupled to the control terminal Inc_c of the circuit unit Uk, thereby realizing a function equivalent to the AND gate element.

Through the comparator Xk, the comparator XNk and the detector Ak, the control logic circuit CON may provide a valid control signal to the control terminal Inc_c of the circuit unit Uk, in a case where the data in the register REG1 of the circuit unit Uk is the same as the data received via the input terminal Val_in of the circuit module and the data in the register REG2 of the circuit unit Uk is not equal to 0.

For example, in a case where the circuit module receives data V1 via the input terminal Val_in, and the data in the registers REG1 and REG2 of the circuit unit U2 are V1 and 3, respectively, the valid2 output by the comparator X2 is 1 (i.e. the data in REG2 of U2 is not equal to 0), and the match2 output by the comparator XN2 is 1 (i.e. the data in RE1 of U2 is the same as V1). The detector A2 outputs a valid control signal (e.g., 1) in a case where both inputs it received are 1. Accordingly, data 3 in the register REG2 of the circuit unit U2 becomes 4 after being processed by the accumulator INC.

In another embodiment, the detector Ak may further comprise a signal generator (not shown), so as to generate a valid control signal in a case where the data in the register REG1 of the circuit unit Uk is the same as the data received via the input terminal Val_in of the circuit module and the data in the register REG2 of the circuit unit Uk is not equal to 0, for example, a signal meeting certain voltage value requirements or frequency requirements. In another embodiment, such a signal generator may be set between the detector Ak and the control terminal Inc_c of the circuit unit Uk independently of the detector Ak.

A portion of the control logic circuit CON for generating the control signal for the control terminal Inc_c of each circuit unit Uk may not be limited to the manner in the example in FIG. 4. In another embodiment, for example, the control logic circuit CON may comprise a processor and a counter. The processor may be configured to alternately detect the data in the registers REG1 and REG2 of each circuit unit Uk, and to provide a valid control signal to the control terminal Inc_c of the circuit unit Uk in a case where the data in the register REG1 of the circuit unit Uk is the same as the data received via the input terminal Val_in of the circuit module and the data in the register REG2 of the circuit unit Uk is not equal to 0, so as to add 1 to the value of the data in the register REG2 of the circuit unit Uk. The counter may be a loop counter from 1 to n, and may comprise a register, for identifying the circuit unit Uk which is currently detected by the processor.

As shown in FIG. 4, the control logic circuit CON may further comprise a detector NOR. An input terminal of the detector NOR may be coupled to each comparator XNk, respectively, and an output terminal of the detector NOR may be coupled to the control terminals Val_c and Cnt_c of each circuit unit Uk. The detector NOR may be configured to generate a valid control signal in a case where an output signal or message matchk from each comparator XNk is 0 (i.e. all data in the register REG1 of each circuit unit Uk is different from the data received via the input terminal Val_in of the circuit module), and to provide the generated valid control signal to the control terminals Val_c and Cnt_c of each circuit unit Uk.

In the example of FIG. 4, the detector NOR may comprise a NOR gate element, wherein each input terminal of the NOR gate element is coupled to an output terminal of the comparator XNk, respectively, and an output terminal of the NOR gate element is coupled to the control terminals Val_c and Cnt_c of each circuit unit Uk. In another embodiment, the detector NOR may also comprise a signal generator (not shown), so as to generate a valid control signal based on the output of the NOR gate element, for example, a signal that meets certain voltage value requirements or frequency requirements. In another embodiment, such a signal generator may be set among the detector NOR and the control terminals Val_c and Cnt_c of the circuit unit Uk independently of the detector NOR.

In a case where the control terminals Val_c and Cnt_c of each circuit unit Uk receive a valid control signal from the control logic circuit CON, the circuit unit U1 replaces the data in the register REG1 and the data in the REG2 of the circuit unit U1 with data from the input terminals Val_in and Cnt_in of the circuit module, respectively, and each circuit unit Uk transfers the data in the corresponding registers REG1 and REG2 to a next circuit unit Uk+1. For example, the circuit unit U1 provides the old data in its registers REG1 and REG2 to U2, and replaces the old data with new data; the circuit unit U2 provides the data in its registers REG1 and REG2 to U3 and updates the data with the data from circuit unit U1; and so on.

In the example of FIG. 4, the control logic circuit CON may further comprise a detector AND1 and a control switch SW, to control whether to output the data in the registers REG1 and REG2 of the circuit unit Un.

As shown in FIG. 4, two input terminals of the detector AND1 may be coupled to the output terminal of the detector NOR and the output terminal of the comparator Xn, respectively, and may output a valid control signal update_valid in a case where the data input by both input terminals are 1 (i.e. the data in the register REG1 of each circuit unit Uk is different from the data received via the input terminal Val_in, and the data in the register REG2 of the circuit unit Un is not equal to 0). In an embodiment, detector AND1 may comprise an AND gate element.

The switch SW may have a control terminal, and the control terminal of the switch SW may be coupled to the output terminal of the detector AND1. Further, two input terminals of the switch SW are respectively coupled to the output terminals Val_o and Cnt_o of the circuit unit Un, and two output terminals of the switch SW are respectively coupled to the output terminals Val_out and Cnt_out of the circuit module. The switch SW may turn on the output terminal Val_o of the circuit unit Un and the output terminal Val_out of the circuit module, and turn on the output terminal Cnt_o of the circuit unit Un and the output terminal Cnt_out of the circuit module, in a case where its control terminal receives the valid control signal update_valid, otherwise, turn off the connection between the output terminal Val_o of the circuit unit Un and the output terminal Val_out of the circuit module and the connection between the output terminal Cnt_o of the circuit unit Un and the output terminal Cnt_out of the circuit module.

Thus, the control logic circuit CON may output the data in the registers REG1 and REG2 of the circuit unit Un in a case where the data in the register REG1 of each circuit unit Uk is different from the data received via the input terminal Val_in and the data in the register REG2 of the circuit unit Un is not equal to 0.

In one embodiment, the switch SW may include a plurality of transistors, wherein the gate, the source and the drain of a transistor are respectively coupled to the output terminal of the detector AND1, the output terminal Val_o of the circuit unit Un and the output terminal Val_out of the circuit module; the gate, the source and the drain of another transistor are respectively coupled to the output terminal of the detector AND1, the output terminal Cnt_o of the circuit unit Un, and the output terminal Cnt_out of the circuit module, and these transistors may be turned on in a case where their gates receive the valid control signal update_valid. In another embodiment, the switch SW may further include one or more multiplexers or multi-way switches.

In another embodiment, the control logic circuit CON may also provide the control signal update_valid output by the detector AND1 to the outside of the control logic circuit CON.

FIG. 5 shows another example of a circuit module according to an embodiment of the present disclosure. Differences between the example of FIG. 5 and the example of FIG. 4 are described below, while the same between the two examples would not be described again.

Unlike the example in FIG. 4, in the example shown in FIG. 5, the input terminals Val_i and Cnt_i of each circuit unit Uk in the statistical circuit array ARR are respectively coupled to the input terminals Val_in and Cnt_i of the circuit module, instead of being coupled to the output terminals Val_o and Cnt_o of the previous circuit unit, as shown in FIG. 4.

Further, in the example shown in FIG. 5, a plurality of input terminals of the detector AND1 are respectively coupled to the output terminal of the detector NOR and the output terminal of each comparator Xk (instead of being coupled only to the output terminal of the detector NOR and the output terminal of the comparator Xn as in the example of FIG. 4). This means that in the example shown in FIG. 5, in a case where all data in the register REG1 of each circuit unit Uk is different from the data received via the input terminal Val_in, the detector AND1 outputs the valid control signal update_valid only in a case where all data in the register REG2 of each circuit unit Uk is not equal to 0 (instead of only considering the data in register REG2 of Un as in the example of FIG. 4).

As described above, in the example of FIG. 4, the data in the registers REG1 and REG2 of the circuit unit Un are fixedly selected as the output object, and the switch SW may be relatively simply used to control the output. However, unlike the example of FIG. 4, in the example of FIG. 5, the selector need to select one circuit unit Uj (1≤j≤n) from all circuit units U1 to UN and to output the data in the registers REG1 and REG2 of circuit unit Uj in a case where all data in the register REG1 of each circuit unit Uk is different from the data received via the input terminal VAL_in and all data in the register REG2 of each circuit unit Uk is not equal to 0.

Accordingly, the control logic circuit CON may include a selector US1, a multiplexer VSEL, and a multiplexer CSEL. A control terminal of the selector US1 may be coupled to the output terminal of the detector AND1, and select j from 1 to n in a case where its control terminal receives the valid control signal update_valid from the detector AND1. A control terminal of the multiplexer VSEL may be coupled to the output terminal of the selector US1, a plurality of input terminals of the multiplexer VSEL may be coupled to the output terminal Val_o of each circuit unit Uk, respectively, and the output terminal of the multiplexer VSEL may be coupled to the output terminal Val_out of the circuit module, such that the multiplexer VSEL may output data in the register REG1 of the circuit unit Uj in response to receiving the j value from the selector US1 at its control terminal. A control terminal of the multiplexer CSEL may be coupled to the output terminal of the selector US1, a plurality of input terminals of the multiplexer CSEL may be coupled to the output terminal Cnt_o of each circuit unit Uk, respectively, and the output terminal of the multiplexer CSEL may be coupled to the output terminal Cnt_out of the circuit module, such that the multiplexer CSEL may output data in the register REG2 of the circuit unit Uj in response to receiving the j value from the selector US1 at its control terminal.

In one embodiment, the selector US1 may be coupled to the output terminal Cnt_o of each circuit unit Uk and may include one or more comparators (for example, an integrated value comparator such as CC14585 or 74LS85). In this embodiment, the comparator may compare the data in the register REG2 of each circuit unit Uk and determine j from 1 to n, such that the value of the data in the register REG2 of the circuit unit Uj is the largest or smallest among the values of the data in the registers REG2 of all the circuit units U1 to Un.

In another embodiment, the selector US1 may include a random number generator (for example, a true random number generator that generates random numbers based on physical processes) to generate a random number j between 1 and n.

In another embodiment, the selector US1 may fixedly select a value j (e.g., n) between 1 and n and fixedly transfer j to the multiplexers VSEL and CSEL, such that the multiplexers VSEL and CSEL fixedly select the data in the registers REG1 and REG2 of Uj to output. Thus, the selector US1, the multiplexer VSEL, and the multiplexer CSEL may be simplified to, for example, a form similar to the switch SW in the example of FIG. 4, and the two input terminals of the switch SW may be respectively coupled to the output terminals Val_o and Cnt_o of Uj.

For example, in a case where USn is fixedly selected, the selector US1, the multiplexers VSEL and CSEL in FIG. 5 may simply be realized in the form of the switch SW in FIG. 4. Therefore, the control logic circuit CON in the example of FIG. 4 may be considered as a simplified form of the control logic circuit CON in the example of FIG. 4, and in one aspect, the switch SW in the control logic circuit CON in the example of FIG. 4 may also use, for example, a form of a combination of the selector US1, and the multiplexers VSEL and CSEL in the example of FIG. 5.

Further, in the example of FIG. 5, the control logic circuit CON may further comprise a signal controller SCON. The signal controller SCON receives the value j output from the selector US1, provides a valid control signal to the control terminals Val_c and Cnt_c of the circuit unit Uj, and provides invalid control signals to the control terminals Val_c and Cnt_c of other circuit units, such that the circuit unit Uj may update the data in the corresponding registers REG1 and REG2 with data from the input terminals Cnt_in and Val_in of the circuit module, meanwhile, maintain the data in the registers of other circuit units unchanged.

In an embodiment, the signal controller SCON may comprise, for example, an alternative type of n multiplexers (not shown, an input terminal corresponding to a valid control signal may be coupled to a valid signal, and the other input terminal may be coupled to an invalid signal), wherein the output terminal of each multiplexer may be coupled to the control terminals Val_c and Cnt_c of the corresponding circuit unit Uk, and each multiplexer may output a valid control signal in a case where the information (e.g., number j) indicated by the control signal received via the corresponding control terminal is the same as the serial number of the multiplexer (such a determination may be realized, for example, by means of a logic circuit), otherwise output an invalid control signal.

Further, in the example of FIG. 5, the control logic circuit CON may further comprise a detector NA, a detector AND2, and a selector US2.

The detector NA has a plurality of input terminals respectively coupled to the output terminal of each comparator Xk, and outputs a valid signal in a case where not all of validk are 1 (i.e. there is a REG2 of a circuit unit whose data is equal to 0). In one embodiment, the detector NA may comprise a NAND gate element.

The detector AND2 has two input terminals respectively coupled to the output terminal of the detector NA and the output terminal of the detector NOR, and output a valid signal in a case where both received input data are 1 (i.e. the data in the register REG1 of each circuit unit Uk is different from the data received via the input terminal Val_in of the circuit module, and there is a register REG2 of a circuit unit whose data is equal to 0). In one embodiment, detector AND2 may include a NAND gate element.

The realization manner of the selector US2 may be similar to the selector US1. The difference is that the selector US2 needs to select one circuit unit Uj from the circuit unit with data equal to 0 in the corresponding register REG2 (instead of all circuit units). Thus, the logic circuit in the selector US2 or the multiplexer may also be coupled to the output terminal of each comparator Xk or the output terminal of each circuit unit Uk. Then, the selector US2 may select (e.g., in an embodiment, randomly selected by means of a random number generator) one circuit unit Uj from all the circuit units that meets the above conditions, the data in the register REG2 of the circuit unit Uj is equal to 0 and the data in the register REG1 is also different from the data received via the input terminal Val_in of the circuit module. Then, the selector US2 may transmit a message (e.g., number j) related to the selected circuit unit Uj to the signal controller SCON.

In another embodiment, the selector US2 may also comprise a counter. For example, the initial value of the counter may be set to 0. When the circuit module receives data via the input terminal Val_in, in a case where all match1 to matchn are 0 and at least one of valid1 to validn is 0, i.e. in a case where the detector AND2 outputs 1, the counting value of the counter may add 1, and the current counting value is transferred to the signal controller SCON. In this embodiment, the circuit units U1 to Un would be used successively to store valid data. In another embodiment, the counter may also count from large to small, and in this embodiment, the circuit units Un to U1 would be sequentially used to store valid data.

When receiving the output value j from the selector US2, the signal controller SCON provides a valid control signal to the control terminals Val_c and Cnt_c of the circuit unit Uj, and provides invalid control signals to the control terminals Val_c and Cnt_c of other circuit units, such that the circuit unit Uj may update the data in the corresponding registers REG1 and REG2 with data from the input terminals Cnt_in and Val_in of the circuit module, at the same time, maintain the data in the registers of other circuit units unchanged.

Since the detectors NA and AND1 would not output 1 simultaneously, the selectors US2 and US1 would not function simultaneously. That is to say, the selectors US1 and US2 respectively transmit signals or messages about j to the control terminal of the signal controller SCON under different circumstances without causing a collision. Therefore, although the selectors US1 and US2 are respectively coupled to different terminals of the signal controller SCON as shown in FIG. 5, the two terminals of the signal controller SCON would not receive a valid control signal simultaneously. Therefore, in an embodiment, the signal controller SCON may be set with a control terminal, and the output terminal of the selectors US1 and US2 may be coupled to this control terminal.

FIG. 6 shows another example of a circuit module according to an embodiment of the present disclosure. In this example, the statistical circuit array ARR comprises only one circuit unit U, and the control logic circuit CON may comprise only a pair of comparators Xu and XNu and a detector Au corresponding to the circuit unit U, wherein similar to the example in FIG. 4 or FIG. 5, two input terminals of the comparator XNu may respectively receive data from the output terminal Val_o of the circuit unit U and the input terminal Val_in of the circuit module, and the output signal matchu of the comparator XNu may be a valid signal (e.g., 1) in a case where the two input data are the same, and an invalid signal (e.g., 0) in a case where the two input data are not the same; the input terminal of the comparator Xu may be coupled to the output terminal Cnt_o of the circuit unit U, and its output signal validu may be valid (e.g., 1) in a case where the data in the register REG2 of the circuit unit U is not equal to 0, and is invalid (e.g., 0) in a case where the data in the register REG2 of the circuit unit U is equal to 0; two input terminals of the detector Au may be coupled to the output terminals of the comparators Xu and XNu, respectively, and its output terminal may be coupled to the control terminal Inc_c of the circuit unit U, and may output a valid control signal in a case where both received input signals are valid (e.g., both are 1), otherwise, output an invalid control signal.

Since the statistical circuit array ARR in the example of FIG. 6 comprises only one circuit unit U, the detector NOR in the example of FIG. 4 or FIG. 5 is replaced with a NOT gate element or an inverter N, or may comprise a NOT gate element or an inverter N, and the circuit portion of the control logic circuit CON for controlling whether to output the data in the registers REG1 and REG2 of the circuit unit U may use the simple form in the example of FIG. 4.

FIG. 6 is actually an example of an implement of the example in FIG. 4 or FIG. 5 in a simple case.

Although the respective comparators and detectors of the control logic circuit CON in the examples of FIG. 4 to FIG. 6 are shown as a single logic gate element (e.g., in FIG. 4 to FIG. 6, the logic gate symbols recommended by IEEE are used for representing), however, each element is only used to represent basic functions realized by the corresponding comparator or detector or basic elements included in the corresponding comparator or detector in an embodiment, and it does not mean that these comparators and/or detectors must comprise only one logic gate element or must be realized by such logic gate elements. Further, the various multiplexers (or multi-way switches) and switches SW (a simple form of multiplexer) in the examples of FIG. 4 to FIG. 6 may be realized by one or more logic gate elements, and may also be realized by one or more electronic switches with a control terminal, such as a transistor, and may also be realized by one or more multiplexers such as 74LS153, 74LS151, and the like. Further, the selectors US1 and/or US2 may be voting circuits realized by a multiplexer and/or one or more logic gate elements, and may comprise a random number generator.

For example, in the examples of FIG. 4 to FIG. 6, the data in the register REG2 of each circuit unit in the statistical circuit array ARR may no longer be equal to 0 after the circuit module receives n (wherein n=1, in the example of FIG. 6) parsed data being different from each other. That is to say, the signal validk corresponding to any one of the circuit units Uk (1≤k≤n) may be 0 only during an initial stage, and during this initial stage, the circuit module receives and makes a statistic operation on less than n different parsed data (i.e. the data in REG2 of at least one circuit unit is 0) and would not output any data via the output terminals Val_out and Cnt_out; however, at any time points after this initial stage, all signals valid1 to validn may not be 0.

Therefore, in an embodiment, the control logic circuit CON may comprise a counter, and this counter may count from 1 to n, and the corresponding counting value may add 1 only in a case where all the signals match1 to matchn are not 0. The control logic circuit CON may not output any data via the output terminals Val_out and Cnt_out in a case where the value of the counter is less than or equal to n, and output data in the registers REG1 and REG2 of the circuit unit Un via the output terminals Val_out and Cnt_out in a case where the value of the counter is greater than n and all of the signals match1 to matchn are not 0.

In this embodiment, it may not be necessary to set the comparators X1 to Xn or Xu in FIG. 4 to FIG. 6, and the detectors A1 to An or Au may detect the current value of the counter and the signal values of match1 to matchn or matchu. The detector AND1 may only receive the output value of the detector NOR and the current value of the counter, and may output the valid control signal update_valid in a case where the current value of the counter is greater than n and the detector NOR outputs 1. Further, it is not necessary to set the detectors NA and AND2 in the example of FIG. 5, and the functions of the selector US1 and the multiplexers USEL and CSEL may be realized using the simple switch SW in the example of FIG. 4. It should be understood that the counting manner (including the initial value, the maximum value of counting, etc.) of the counter in this embodiment may not be limited to the above examples.

In another embodiment, it is provided a flag bit register which may be a register with at least n bits, n bits of which can be selected and each selected bit is made to be corresponding to one circuit unit Uk, respectively. For example, the rightmost bit corresponds to the circuit unit U1, and the second bit of the right corresponds to the circuit unit U2, and so on. The corresponding relationship between each bit in the flag bit register and each circuit unit Uk may be arbitrarily set as needed.

Each bit of the flag bit register may be set to 0. Then, in a case where a circuit unit Uk stores valid data, the bit in the flag bit register corresponding to Uk may be set to 1. Thereby, the value of the signal validk related to each circuit unit Uk may be simply and conveniently recorded.

In this embodiment, it is not necessary to provide the detectors X1 to Xn or Xu, and each of the detectors A1 to An or Au may receive an output from a corresponding one of the detectors XN1 to XNn or Xu and an output Flags of this flag bit register. For example, the detector Ak may output the result of (Flags&(1<<k)) && matchk, wherein & represents a bitwise AND operation, << represents shifting to the left, 1<<k represents shifting the binary representation of 1 to the left by k bits, and && represents logic determination of AND.

Further, in this embodiment, the signal controller SCON may conveniently determine whether all of the data in the register REG2 of each circuit unit Uk are not 0 according to the value Flags in the flag bit register, and may simply and conveniently determine and select the circuit unit Uj with data being 0 in the corresponding register REG2. Accordingly, it is not necessary to provide the detectors NA, AND and the selector US2, and it is not necessary for the detector AND1 to receive the signals valid1 to validk, instead, the detector AND1 determines whether to output a valid control signal update_valid according to the output of the detector NOR and the value in the flag bit register.

It should be understood that implementation of the control logic circuit CON according to embodiments of the present disclosure may not be limited to the examples in FIG. 4 to FIG. 6.

In a practical application, input data (e.g., one parsed data from the parser, or data from the output Val_out of another circuit module) may be provided to the input terminal Val_in of the circuit module as shown in any of FIG. 3 to FIG. 6, and an initial counting value (e.g., 1 or data from the output terminal Cnt_out of another circuit module) is provided to the input terminal Cnt_in.

Figure 7:
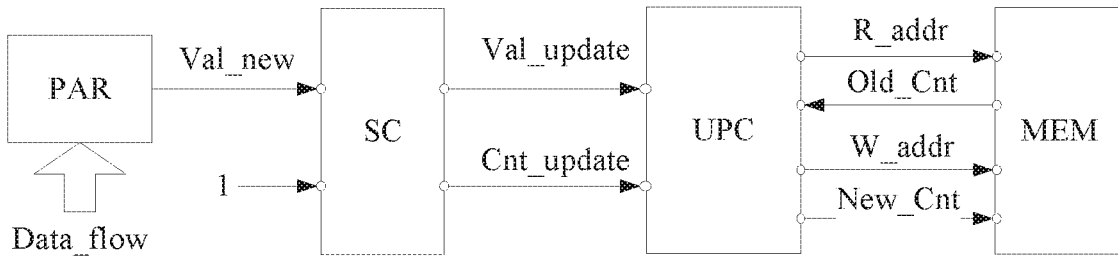
FIG. 7 schematically shows an example of an apparatus for data statistics according to an embodiment of the present disclosure.
Figure 8:
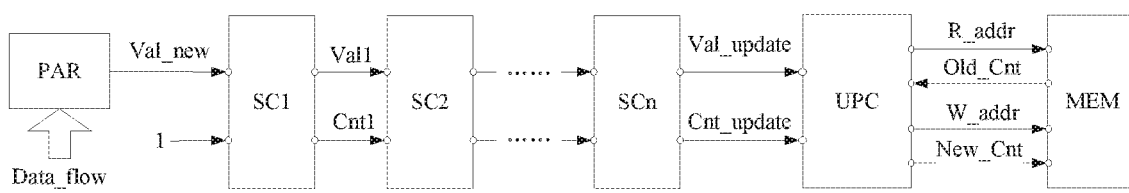
FIG. 8 schematically shows another example of an apparatus for data statistics according to an embodiment of the present disclosure.

FIG. 7 and FIG. 8 show an example of an apparatus for data statistics according to an embodiment of the present disclosure.

The apparatus shown in FIG. 7 comprises a circuit module SC as shown in any of FIG. 4 to FIG. 6, whose input terminal Val_in and Cnt_in may receive an input data Val_new and the constant value 1, respectively.

The apparatus shown in FIG. 8 comprises a plurality of circuit modules SC1, SC2, . . . , SCn as shown in any one of FIG. 4 to FIG. 6 connected in series, wherein the input terminals Val_in and Cnt_in of each circuit module (e.g., SC2) except for SC1 may be respectively coupled to the output terminals Val_out and Cnt_out of the previous circuit module (e.g., SC1) of this circuit module, and the input terminals Val_in and Cnt_in of the circuit module SC1 may receive the input data Val_new and the constant value 1, respectively.

As shown in FIG. 7 or FIG. 8, the apparatus may further comprise an update circuit UPC. Two input terminals of the update circuit UPC may be coupled to the output terminals Val_out and Cnt_out of the last one circuit module (also referred to herein as the last circuit module, for example, SC in FIG. 7 or SCn in FIG. 8), respectively, to receive the data Val_update and Cnt_update.

As described above, the update_valid of the control logic circuit CON may also be provided to the outside of the control logic circuit CON. Accordingly, in one embodiment, the SC in FIG. 7 or the update circuit UPC in FIG. 8 may be made to process the received Val_update and Cnt_update only in a case where the valid signal update_valid is detected or received.

Further, as shown in FIG. 7 or FIG. 8, the apparatus may further comprise a parser PAR and/or a memory MEM.

The parser PAR may parse an input data stream Data_flow to be performed a statistic operation, and provide each generated parsed data Val_new to the SC or SC1. For example, in a case where the Data_flow is an image data stream, the parser PAR may parse information of one or more dimensions of the image from the image data stream, such as a luminance value, a color value of a pixel point in the image, and a serial number of subgraph to which the pixel point belongs and a combination of a plurality of information. For example, in a case where the image to be counted is divided into 4 rows and 3 columns, a total of 12 subgraphs by the image processing algorithm, the parser PAR may obtain the serial number of the subgraph (e.g., may be represented by 4 bits) where each pixel is located. Further, the parser PAR may combine the color information (e.g., RGB or YUV) of the pixel points themselves to generate a pixel information object to be performed a statistic operation as the parsed data Val_new. For example, the parsed data may be represented by 12 bits, wherein 4 bits represent the serial number of the subgraph to which the pixel belongs, and the other 8 bits represent the gray value of the pixel. For example, for a pixel with the gray value 250 in the subgraph (e.g., number is 7) of row 2 and column 0, the corresponding parsed data may be (7, 250) or (2, 0, 250).

It should be understood that the type, the representation manner, and the like of the parsed data Val_new are not limited to the above example. Accordingly, the data stream Data_flow provided to the parser PAR is not limited to the image data stream, and the processing procedure and output in the parser PAR are not limited to the above example. In another embodiment, the parser PAR may be at outside of the apparatus and provide data to the apparatus via, for example, an 110 interface.

The memory MEM may be coupled to the update circuit UPC through an interface, and may receive a read address information R_addr from the update circuit UPC and return the stored old statistic value Old_Cnt related to the data Val_update to the update circuit UPC. Further, the stored statistic value related to the data Val_update may also be updated according to a write address W_addr from the update circuit UPC and a new statistic value New_Cnt related to the data Val_update. The memory MEM may be any type of memory realized by using any technology such as SRAM or DRAM, and may comprise one or more, for example, SRAM modules. In another embodiment, the memory MEM may be provided outside of the apparatus and communicate with the apparatus via the I/O interface of the apparatus.

Figure 9:
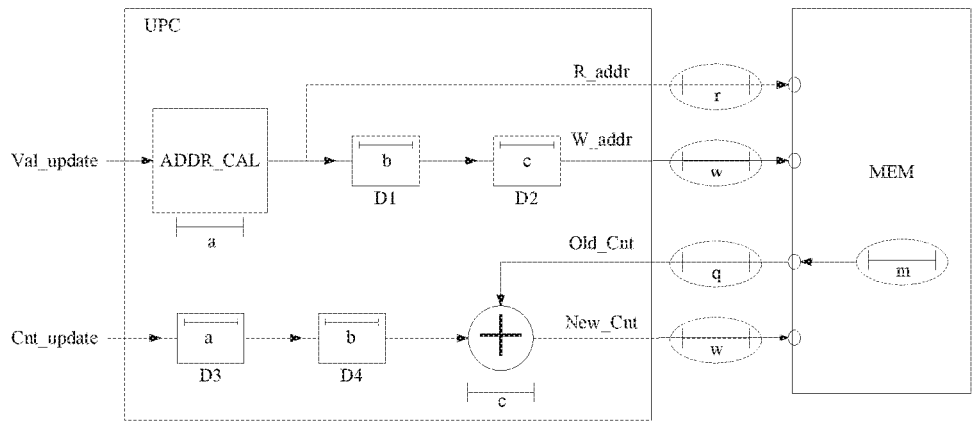
FIG. 9 schematically shows an example of an update circuit in an apparatus for data statistics according to an embodiment of the present disclosure.

FIG. 9 shows an example of the update circuit UPC in FIG. 7 or FIG. 8.

As shown in FIG. 9, the update circuit UPC may comprise an address calculator ADDR_CAL and an adder (represented by "+" in FIG. 9).

An input terminal of the address calculator ADDR_CAL may receive Val_update, calculate an address of the storage location of Val_update in the memory MEM according to Val_update, and transmit the calculated read address to the memory MEM, to generate a read logic for the memory MEM.

The adder may receive Cnt_update, and may receive the old statistic value Old_Cnt related to Val_update returned by the memory MEM, then add Cnt_update with Old_Cnt and obtain the new statistic value New_Cnt related to Val_update. Then, the update circuit UPC may transmit the write address W_addr (may be the same as the read address R_addr) and the new statistic value New_Cnt calculated by the adder to the memory MEM, and accordingly generate a write logic for the memory MEM.

Assuming that the delay (for example, period number) from obtaining the read address R_addr to starting to input the old statistic value Old_Cnt is m within the memory MEM, the delay in transmitting the old statistic value Old_Cnt from the memory MEM to the update circuit UPC is q, the delay caused by the calculation of the adder is c, the delay in transmitting the new statistic value New_Cnt and the write address W_addr to the memory MEM is w, then, the number of all circuit units of all statistical circuit arrays in all circuit modules SC or SC1 to SCn coupled between the parser and the update circuit UPC may be made greater than or equal to m+q+c+w−1, to ensure the correctness of the data update, for example, to ensure that the old statistic value Old_Cnt read from the memory MEM each time must be a statistical result that has been previously updated correctly.

In a case where the memory MEM does not support performing both read operation and write operation to the same address at the same time, the number of all circuit units may be greater than m+q+c+w−1. For example, in a case where the memory MEM has no read/write path delay (or the read/write path delay may be ignored), if the memory MEM may return the read data in one period, and does not support performing both the read operation and the write operation to the same address at the same time, then, the number of all circuit units is only greater than c (i.e. the delay of the adder in the update circuit UPC).

Accordingly, the number of registers required in the apparatus according to embodiments of the present disclosure may only be greater than or equal to 2*(m+q+c+w−1) or greater than 2c, without necessarily providing a corresponding register for each data of all performed statistic operations, thereby the number of required registers may be greatly reduced, thus, hardware cost and power consumption are greatly reduced.

In order to coordinate the action of reading, calculation and storage of data and ensure the correctness of data update, as shown in FIG. 9, the update circuit UPC may also comprise delay elements D1, D2, D3 and D4, wherein the delay elements D1 and D2 may be coupled in series between the address calculator ADDR_CAL and the memory MEM, and the delay elements D3 and D4 may be coupled in series between the output terminal Cnt_out of the last circuit module SC or SCn and the adder.

The delay element D3 may delay the received Cnt_update by a periods to match the delay a caused by the processing in the address calculator ADDR_CAL. The delay elements D1 and D4 may output the received data after they are delayed b periods, b may be equal to r+m+q, wherein r represents the delay of transmitting the read address R_addr to the memory MEM. The delay element D2 may delay the address information (W_addr) from the delay element D1 related to the write logic of the memory MEM by c periods, to match the delay c caused by the processing in the adder.

In another embodiment, a delay element may be used to replace both delay elements D1 and D2, and another delay element may be used to replace both delay elements D3 and D4. In another embodiment, one or both of delay elements D1 and D2 may be included in the address calculator ADDR_CAL, and one or both of the delay elements D3 and D4 may be included in the adder. In another embodiment, the delay during the data transmission process may also be controlled by a software, and it does not need to provide a delay element in this embodiment.

The number of periods required from a pair of Val_update and Cnt_update entering into the update circuit UPC to the reading of the old statistic value Old_Cnt of the Val_update in the memory MEM is a+r+m+q, and the number of periods required from a pair of Val_update and Cnt_update entering into the update circuit UPC to the new statistic New_Cnt updated into the memory MEM is a+b+c+w=a+r+m+q+c+w.

Figure 10:
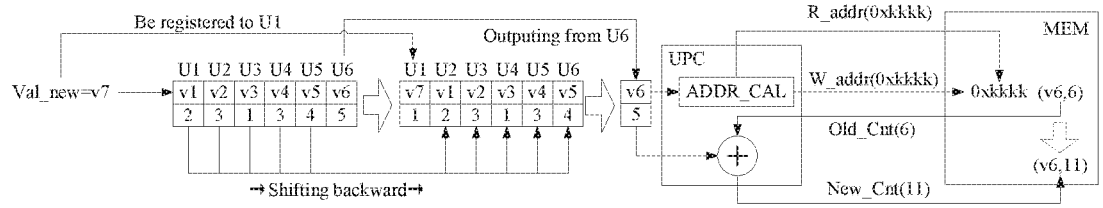
FIG. 10 schematically shows an example of a working process of an apparatus for data statistics according to an embodiment of the present disclosure.
Figure 10:
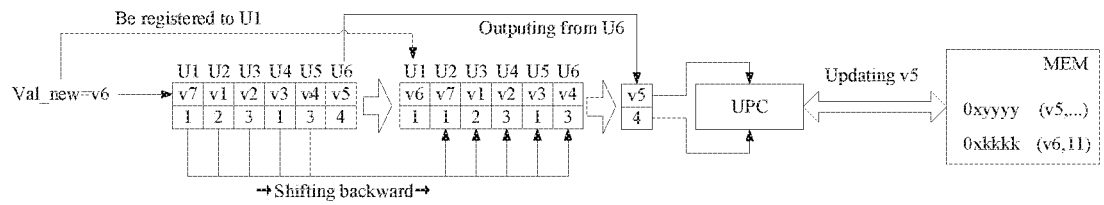
Figure 11:
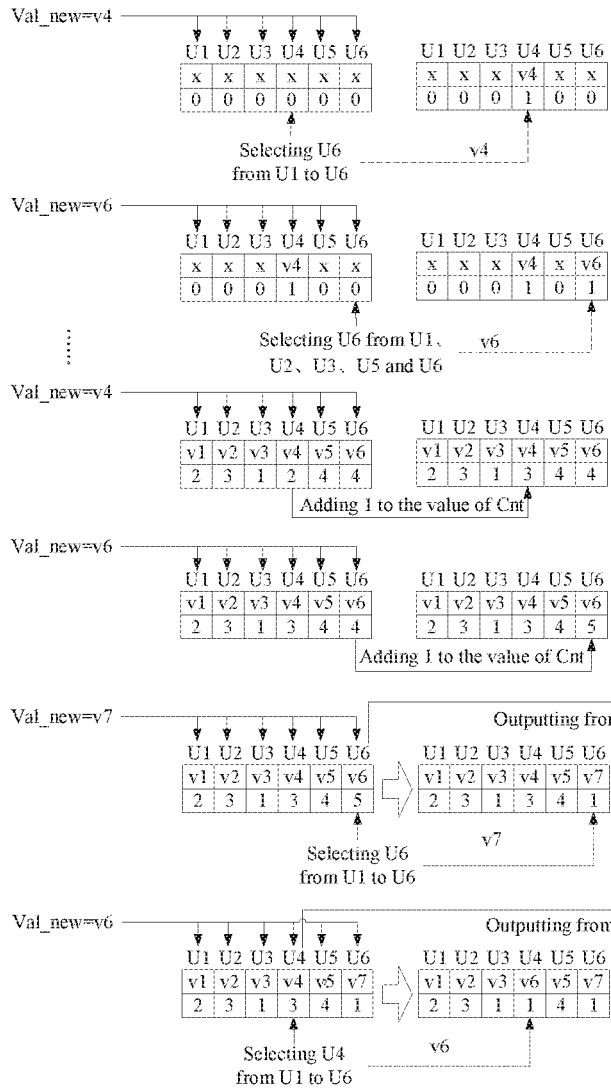
FIG. 11 schematically shows another example of a working process of an apparatus for data statistics according to an embodiment of the present disclosure.
Figure 11:
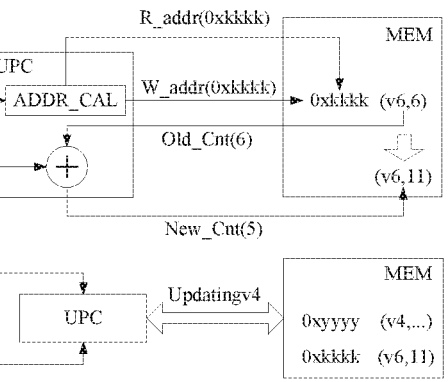

FIG. 10 and FIG. 11 show an example of a working process of an apparatus for data statistics according to an embodiment of the present disclosure.

In the example of FIG. 10, the apparatus comprises a circuit module for data statistics which includes six circuit units U1 to U6 for data statistics, and the six circuit units are connected together in series in the manner of the example in FIG. 4 (i.e. n=6 in the example of FIG. 4), and each of U1 to U6 is represented by two blocks adjacent to each other from top to bottom, and the upper block represents the register REG1 of the corresponding circuit unit, and the block below represents the register REG2 of the corresponding circuit unit. In a case where the data (i.e. statistic value) in the register REG2 is 0, the data in the corresponding register REG1 may be special invalid data x which is different from any of the parsed data. V1 to v7 represent valid parsed data that are different from each other.

Initially, each of the circuit units U1 to U6 does not store valid parsed data and corresponding statistic value, therefore, the data in the registers REG2 of all circuit units is 0.

In the example of FIG. 10, the parsed data Val_new=v6 is firstly provided to the apparatus. At this time, valid1 to valid6 are 0 (i.e. the data in the registers REG2 of all the circuit units U1 to U6 is 0, and accordingly, the data in the registers REG1 and REG2 of all the circuit units U1 to U6 are invalid data), respectively, meanwhile, match1 to match6 are also 0, respectively. Therefore, the control logic circuit CON provides a valid Val_c signal, a valid Cnt_c signal, and an invalid Inc_c signal to each of the circuit units U1 to U6, such that the circuit unit U1 stores the parsed data v6 in the corresponding register REG1 and stores the statistic value 1 in the corresponding register REG2.

Each of the circuit units U1 to U5 respectively transfers the invalid data in the corresponding registers REG1 and REG2 to the corresponding subsequent circuit unit, for example, U1 transfers the invalid data pair (x,0) originally stored in the registers REG1 and REG2 of U1 to U2, and U2 transfers the invalid data pair (x,0) originally stored in the registers REG1 and REG2 of U2 to U3, and so on. The control logic circuit CON detects that the data in the circuit unit U6 is invalid data (valid6=0), therefore, the control signal update_valid=0. Accordingly, the control logic circuit CON would not output an invalid data pair (x, 0) in the circuit unit U6 at the output terminal Val_out and Cnt_out.

Then, the parsed data Val_new=V5 is provided to the apparatus. At this time, the control logic circuit CON detects that valid1=1, valid2 to valid6 are 0, respectively, and match1 to match6 are all 0, respectively. Therefore, the control logic circuit CON provides each of the circuit units U1 to U6 with a valid Val_c signal, a valid Cnt_c signal, and an invalid Inc_c signal, such that the circuit unit U1 transfer the previously stored valid data pair (v6,1) to the circuit unit U2, and stores the parsed data v5 in the corresponding register REG1, and stores the statistic value 1 in the corresponding register REG2. At this time, the data in the circuit unit U6 is still invalid data (valid6=0), therefore, the control signal update_valid is still 0. Accordingly, the control logic circuit CON still could not output an invalid data pair (x,0) in the circuit unit U6 at the output terminal Val_out and Cnt_out.

After processing six (the same as the number of circuit units comprised) different parsed data, each circuit unit would store valid data, respectively, i.e. the data in the register REG1 of any one of the circuit units is valid data, and the data in the register REG2 of any one of the circuit units is not 0, after that, the valid1 to valid6 in the example of FIG. 10 would always become 1.

In the example of FIG. 10, in a case where the circuit units U1 to U6 store valid data pairs (v1,2), (v2,3), (v3,1), (v4,2), (v5,4), and (v6,4), respectively, Val_new=v4 is provided to the apparatus. At this time, the control logic circuit CON may detect match4=1, and the other match1 to match3, match5 and match6 are 0, respectively, i.e. the data stored in the register REG1 of the circuit unit U4 is the same as Val_new. Thus, the control logic circuit CON provides an invalid Val_c signal, an invalid Cnt_c signal, and a valid Inc_c signal to the control terminal of the circuit unit U4, and provides an invalid Val_c signal, an invalid Cnt_c signal, and an invalid Inc_c signal to the other circuit units, such that the value of the data in REG2 of the circuit unit U4 is incremented by 1, thus, the valid data pair stored in the circuit unit U4 changes from (v4,2) to (v4,3), while the data stored in the other circuit units remain unchanged.

Meanwhile, although valid6=1, since the match4=1, therefore, the control signal update_valid is still 0. Accordingly, the control logic circuit CON could not output the data pair (v6,4) in the circuit unit U6 at the output terminals Val_out and Cnt_out.

Then, the apparatus receives the parsed data Val_new=v6. Similar to the previous case of Val_new=v4, the control logic circuit CON may detect match6=1, and the other match1 to match5 are 0, respectively, i.e. the data stored in the register REG1 of the circuit unit U6 are the same as Val_new. Thus, the control logic circuit CON provides an invalid Val_c signal, an invalid Cnt_c signal, and a valid Inc_c signal to the control terminal of the circuit unit U6, and provides an invalid Val_c signal, an invalid Cnt_c signal, and an invalid Inc_c signal to the other circuit units, such that the value of the data in REG2 of circuit unit U6 is incremented by 1, thus, the valid data pair stored in the circuit unit U6 changes from (v6,4) to (v6,5), while the data stored in the other circuit units remain unchanged. Meanwhile, although valid6=1, since the match6=1, therefore, the control signal update_valid is still 0. Accordingly, the control logic circuit CON could not output the data pair (v6,5) in the circuit unit U6 at the output terminals Val_out and Cnt_out.

Then, the apparatus receives the parsed data Val_new=v7. At this time, the control logic circuit CON may detect that Val_new=v7 is different from the data in REG1 of each of the circuit units U1 to U6, i.e. match1 to match6 are 0, respectively. Therefore, the control signal update_valid inside the control logic circuit CON is 1 at this time, such that the switch SW is turned on, thus, the data pair (v6,5) stored in the circuit unit U6 are output via the output terminals Val_out and Cnt_out.

In another aspect, the control logic circuit CON may provide a valid Val_c signal, a valid Cnt_c signal, and an invalid Inc_c signal to the control terminals of each of the circuit units U1 to U6, such that each of the circuit units U1 to U6 updates the data in the corresponding registers REG1 and REG2 with the data received from the corresponding input terminals Val_i and Cnt_i. Since the circuit units U1 to U6 are connected in series, as a result, the data pairs in each of the circuit units U1 to U5 are respectively shifted backward into the subsequent circuit unit. For example, as shown in FIG. 10, (v1,2) originally stored in U1 is shifted backward into U2, and (v5,4) originally stored in U5 is shifted backward into U6. Meanwhile, the circuit unit U1 stores a new data pair (v7,1).

In response to the control logic circuit CON outputting the originally stored data pair (v6,5) in the circuit unit U6 via Val_out and Cnt_out, the update circuit UPC starts to work. The address calculator ADDR_CAL in the update circuit UPC receives Val_update=v6, and calculates an address 0xkkkk of storage location of v6 in the memory MEM, and generates a read logic for the memory MEM based on a read address R_addr (0xkkkk). The memory MEM returns the old statistic value Old_Cnt=6 corresponding to v6 to the update circuit UPC. The adder in the update circuit UPC receives the statistic value Cnt_update=5 from the control logic circuit CON and the old statistic value Old_Cnt=6 from the memory MEM, performs an add operation based on the both, and obtains a new statistic value New_Cnt=5+6=11. Then, the update circuit UPC generates a write logic based on the memory MEM, and transmits the write address W_addr (0xkkkk) and the new statistic value New_Cnt=11 to the memory MEM. Accordingly, the memory MEM may update the content at the address 0xkkkk from the original (v6, 6) to (v6,11).

Then, the apparatus receives the parsed data Val_new=v6. Since there is not the same data as v6 in the circuit units U1 to U6 at this time, therefore, similarly to the case where the apparatus previously received the parsed data v7, the control logic circuit CON may detect that Val_new=v6 is different from the data in REG1 of each of the circuit units U1 to U6, i.e. match1 to match6 are 0, respectively. Therefore, the control signal update_valid inside the control logic circuit CON is 1 at this time, such that the switch SW is turned on, thus, the data pair (v5,4) stored in the circuit unit U6 are output via the output terminals Val_out and Cnt_out. In another aspect, the control logic circuit CON may provide a valid Val_c signal, a valid Cnt_c signal, and an invalid Inc_c signal to the control terminals of each of the circuit units U1 to U6, such that each of the circuit units U1 to U6 updates the data in the corresponding registers REG1 and REG2 with the data received from the corresponding input terminals Val_i and Cnt_i. Since the circuit units U1 to U6 are connected in series, as a result, the data pairs in each of the circuit units U1 to U5 are respectively shifted backward into the subsequent circuit unit. For example, as shown in FIG. 10, (v7,1) originally stored in U1 is shifted backward into U2. At the same time, the circuit unit U1 stores a new data pair (v6,1).

In response to the control logic circuit CON outputting the originally stored data pair (v5,4) in the circuit unit U6 via Val_out and Cnt_out, the update circuit UPC starts to work, and updates content related to V5 in the memory MEM at 0xyyyy based on the data pair.

In the example of FIG. 11, the apparatus comprises a circuit module for data statistics, the circuit module includes six circuit units for data statistics, and six circuit units are connected in parallel in the manner of the example in FIG. 5 (i.e. n=6 in the example of FIG. 5). Similarly to the example of FIG. 10, in FIG. 11, each of U1 to U6 is also represented by two block adjacent to each other from top to bottom, and the upper block represents the register REG1 of the corresponding circuit unit, and the below block represents the register REG2 of the corresponding circuit unit. Similarly, in a case where the data (i.e. statistic value) in the register REG2 is 0, the data in the corresponding register REG1 may be a special invalid data x which is different from any of the parsed data. V1 to v7 represent valid parsed data that are different from each other. Further, as in the example in FIG. 10, initially, each of the circuit units U1 to U6 does not store valid parsed data and corresponding statistic values, therefore, the data in the registers REG2 of all circuit units are 0.

In the example of FIG. 11, the parsed data Val_new=v4 is firstly provided to the apparatus. At this time, valid1 to valid6 are 0 (i.e. the data in the registers REG2 of all the circuit units U1 to U6 are 0, and accordingly, the data in the registers REG1 and REG2 of all the circuit units U1 to U6 are invalid data), respectively, meanwhile, match1 to match6 are also 0, respectively. The control logic circuit CON selects (e.g., randomly) the circuit unit U4 from the circuit units U1 to U6, and provides a valid Val_c signal, a valid Cnt_c signal, and an invalid Inc_c signal to the circuit unit U4, and provides invalid Val_c signals, invalid Cnt_c signals, and invalid Inc_c signals to other circuit units, such that the circuit unit U4 stores the parsed data v4 in the corresponding register REG1 and stores the statistic value 1 in the corresponding register REG2, and the data in the registers of other circuit units is still invalid data. Accordingly, the control logic circuit CON may generate an invalid control signal update_valid, such that it could not output any data at the output terminals Val_out and Cnt_out.

Then, parsed data Val_new=V6 is provided to the apparatus. At this time, the control logic circuit CON detects that Val_new is different from the data in the register REG1 of each circuit unit, and the data in the registers REG2 of all the circuit units except for the circuit unit U4 is still 0. Thus, the control logic circuit CON selects (e.g., randomly) the circuit unit U6 from all other circuit units except for the circuit unit U4, for example, by the selector US2, and provides a valid Val_c signal, a valid Cnt_c signal, and an invalid Inc_c signal to the circuit unit U6, and provides invalid Val_c signals, invalid Cnt_c signals, and invalid Inc_c signals to all other circuit units except for U6, such that the circuit unit U6 stores the parsed data v6 in the corresponding register REG1 and stores the statistic value 1 in the corresponding register REG2. Since the data in the circuit units U1, U2, U3 and U5 is still invalid data, therefore, the control logic circuit CON still generates an invalid control signal update_valid, such that it would not output any data at the output terminals Val_out and Cnt_out.

After processing six (the same as the number of circuit units comprised) different parsed data, each circuit unit would store valid data, respectively, i.e. the data in the register REG1 of any one of the circuit units is valid data, and the data in the register REG2 of any one of the circuit units is not 0, after that, valid1 to valid6 in the example of FIG. 10 would always become 1.

In the example of FIG. 11, in a case where the circuit units U1 to U6 store valid data pairs (v1,2), (v2,3), (v3,1), (v4,2), (v5,4), and (v6,4), respectively, Val_new=v4 is provided to the apparatus. At this time, the control logic circuit CON may detect match4=1, and the other match1 to match3, match5 and match6 are 0, respectively, i.e. the data stored in the register REG1 of the circuit unit U4 is the same as Val_new. Thus, the control logic circuit CON provides an invalid Val_c signal, an invalid Cnt_c signal, and a valid Inc_c signal to the control terminal of the circuit unit U4, and provides invalid Val_c signals, invalid Cnt_c signals, and invalid Inc_c signals to the other circuit units, such that the value of the data in REG2 of circuit unit U4 is incremented by 1, thus, the valid data pair stored in the circuit unit U4 changes from (v4,2) to (v4,3), while the data stored in the other circuit units remain unchanged. At this time, since match4=1, the control signal update_valid is 0. Accordingly, the control logic circuit CON could not output any data at the output terminals Val_out and Cnt_out.

The apparatus then receives the parsed data Val_new=v6. Similar to the previous case of Val_new=v4, the control logic circuit CON may detect match6=1, and the other match1 to match5 are 0, respectively, i.e. the data stored in the register REG1 of the circuit unit U6 is the same as Val_new. Thus, the control logic circuit CON provides an invalid Val_c signal, an invalid Cnt_c signal, and a valid Inc_c signal to the control terminal of the circuit unit U6, and provides invalid Val_c signals, invalid Cnt_c signals, and invalid Inc_c signals to the other circuit units, such that the value of the data in REG2 of circuit unit U6 is incremented by 1, thus, the valid data pair stored in the circuit unit U6 changes from (v6,4) to (v6,5), while the data stored in the other circuit units remain unchanged. At this time, since match6=1, the control signal update_valid is 0. Accordingly, the control logic circuit CON could not output any data at the output terminals Val_out and Cnt_out.

Then, the apparatus receives the parsed data Val_new=v7. At this time, the control logic circuit CON may detect that Val_new=v7 is different from the data in REG1 of each of the circuit units U1 to U6, i.e. match1 to match6 are 0, respectively. The control logic circuit CON makes the internal control signal update_valid to be 1 at this time. Accordingly, the control logic circuit CON selects (e.g., randomly) the circuit unit U6 from the circuit units U1 to U6, and outputs the data pair (v6,5) stored in U6 via the output terminals Val_out and Cnt_out, and then stores V7 and 1 into the registers REG1 and REG2 of circuit unit U6, respectively.

In response to the control logic circuit CON outputting the originally stored data pair (v6,5) in the circuit unit U6 via Val_out and Cnt_out, the update circuit UPC starts to work. The address calculator ADDR_CAL in the update circuit UPC receives Val_update=v6, and calculates an address 0xkkkk of storage location of v6 in the memory MEM, and generates a read logic for the memory MEM based on a read address R_addr (0xkkkk). The memory MEM returns the old statistic value Old_Cnt=6 corresponding to v6 to the update circuit UPC. The adder in the update circuit UPC receives the statistic value Cnt_update=5 from the control logic circuit CON and the old statistic value Old_Cnt=6 from the memory MEM, performs add operation based on the both, and obtains a new statistic value New_Cnt=5+6=11. Then, the update circuit UPC generates a write logic based on the memory MEM, and transmits a write address W_addr (0xkkkk) and the new statistic value New_Cnt=11 to the memory MEM. Accordingly, the memory MEM may update the content at the address 0xkkkk from the original (v6, 6) to (v6,11).

Then, the apparatus receives the parsed data Val_new=v6. Since there is not the same data as v6 in the circuit units U1 to U6 at this time, therefore, similarly to the case where the apparatus previously received the parsed data v7, the control logic circuit CON may detect that Val_new=v6 is different from the data in REG1 of each of the circuit units U1 to U6, i.e. match1 to match6 are 0, respectively. The control logic circuit CON makes the internal control signal update_valid to be 1 at this time. Accordingly, the control logic circuit CON selects (e.g., randomly) the circuit unit U4 from the circuit units U1 to U6, and outputs the data pair (v4,3) stored in U4 via the output terminals Val_out and Cnt_out, and then stores V6 and 1 into the registers REG1 and REG2 of the circuit unit U4, respectively.

In response to the control logic circuit CON outputting the originally stored data pair (v4,3) in the circuit unit U4 via Val_out and Cnt_out, the update circuit UPC starts to work, and updates content related to V4 in the memory MEM at 0xyyyy based on the data pair.

In the above example, it is assumed that the frequency of parsed data provided by the parser matches the working frequency of hardware in the module or apparatus, e.g., the rate for the module or apparatus used for data statistics to receive parsed data is the same or similar to the rate for the module or device to complete statistics and/or updating of data. In another embodiment, the frequency for the parser to provide parsed data and the working frequency of the hardware may be different. Accordingly, more or fewer circuit units Uk may be used in the apparatus. The Circuit unit, circuit module, and apparatus for data statistics according to embodiments of the present disclosure are not limited to a particular relationship between data stream input and the working frequency of the hardware.

As described above, the circuit unit, circuit module, and apparatus for data statistics according to embodiments of the present disclosure may greatly reduce the number of required registers, thus, hardware cost and power consumption are greatly reduced. Further, the apparatus according to an embodiment of the present disclosure may initiate a read/write operation to the memory MEM only in a case where data needs to be updated, such that frequent memory access operation may be avoided, the overall processing efficiency of the apparatus may be greatly improved, and conflicts or statistical errors that may occur in data statistics and data storage may be avoided.

Unless otherwise required clearly in the context, throughout the description and claims, the wordings such as "comprise" and "include" are to be construed in an inclusive sense, as opposed to an exclusive or exhaustive sense, that is to say, in a sense of "including but not limited to". Additionally, when used in the disclosure, the wordings of "herein", "above", "below" and similar wordings shall refer to the specification and claims as a whole but not to any specific portion of the disclosure. Where the context permits, the terms in the above description using the singular or plural may also include the plural or the singular. With regard to the wording "or" in a case where referring to a list of two or more items, the wording covers all of the following interpretations of the wording: any item in the list, all items in the list, and any combination of items in the list. Further, in the specification and claims of the present disclosure, in a case where the same term is modified by the different ordinal numeral "first", "second", etc., it is intended to distinguish the different entities to which the term refers, rather than to emphasize order or importance.

The embodiments of the present disclosure have been described, however, these embodiments are not intended to limit the scope of the present disclosure, and various omissions, substitutions and changes may be made without departing from the spirit of the disclosure.

What is claimed is:

1. A circuit unit for data statistics, comprising:
   a first subcircuit including a first register and being configured to store data received via a first input terminal of the circuit unit in the first register in a case where a first control terminal of the circuit unit receives a first valid control signal, an output terminal of the first register being coupled to a first output terminal of the circuit unit; and
   a second subcircuit including a second register and being configured to store data received via a second input terminal of the circuit unit in the second register in a case where a second control terminal of the circuit unit receives a second valid control signal, and to increase the value of data stored in the second register by 1 in a case where a third control terminal of the circuit unit receives a third valid control signal, an output terminal of the second register being coupled to a second output terminal of the circuit unit.

2. The circuit unit of claim 1 wherein the first subcircuit further comprises a first selector, a control terminal and a first input terminal of which are respectively coupled to a first control terminal and a first input terminal of the circuit unit, and a second input terminal and output terminal of which are respectively coupled to the output terminal and an input terminal of the first register.

3. The circuit unit of claim 2 wherein the first selector is configured to output data received via the first input terminal of the first selector in a case where the control terminal of the first selector receives the first valid control signal, otherwise output data received via the second input terminal of the first selector.

4. The circuit unit of claim 2 wherein the second subcircuit further comprises:
   a second selector, a control terminal and a first input terminal of which are respectively coupled to the second control terminal and the second input terminal of the circuit unit, and a second input terminal of which is coupled to the output terminal of the second register; and
   a third selector, a control terminal of which is coupled to the third control terminal of the circuit unit, a first input terminal of which is coupled to the output terminal of the second register via an accumulator, and a second input terminal and an output terminal of which are respectively coupled to an output terminal of the second selector and an input terminal of the second register,
   wherein the second selector is configured to output data received via the first input terminal of the second selector in a case where the control terminal of the second selector receives the second valid control signal, otherwise output data received via the second input terminal of the second selector, and
   wherein the third selector is configured to output data received via the first input terminal of the third selector in a case where the control terminal of the third selector receives the first valid control signal, otherwise output data received via the second input terminal of the third selector.

5. A circuit module for data statistics, comprising:
   one or more circuit units of claim 1, including a first circuit unit, the first input terminal and the second input terminal of the first circuit unit receiving an input data and an initial counting value respectively via a first input terminal and a second input terminal of the circuit module; and
   a control logic circuit configured to determine whether the data in the first register of each circuit unit is the same as the input data and whether the data in the second register of each circuit unit is equal to 0, and correspondingly provide a first control signal, a second control signal and a third control signal to each circuit unit according to result of the determination, and selectively output the data in the first register and the second register of one circuit unit in the one or more circuit units respectively via a first output terminal and a second output terminal of the circuit module.

6. The circuit module of claim 5 wherein the one or more circuit units only include the first circuit unit,
and wherein the control logic circuit is configured to provide the first valid control signal and the second valid control signal respectively to the first control terminal and the second control terminal of the first circuit unit in a case where the data in the first register of the first circuit unit is different from the input data, or wherein the control logic circuit is configured to output data in the first register and the second register of the first circuit unit in a case where the data in the first register of the first circuit unit is different from the input data and the data in the second register of the first circuit unit is not equal to 0.

7. The circuit module of claim 5 wherein the one or more circuit units are a plurality of circuit units and further comprises a second circuit unit, the plurality of circuit units being connected in series, such that the first input terminal and the second input terminal of each circuit unit except for the first circuit unit are respectively coupled to the first output terminal and the second output terminal of the previous circuit unit, meanwhile, the first output terminal and the second output terminal of each circuit unit except for the second circuit unit are respectively coupled to the first input terminal and the second input terminal of the subsequent circuit unit,
wherein the control logic circuit is configured to provide the first valid control signal and the second valid control signal respectively to the first control terminal and the second control terminal of each circuit unit in the plurality of circuit units in a case where all data in the first register of each circuit unit in the plurality of circuit units is different from the input data, or wherein the control logic circuit is configured to output data in a first register and a second register of the second circuit unit in a case where all data in the first register of each circuit unit in the plurality of circuit units is different from the input data and data in a second register of the second circuit unit is not equal to 0.

8. The circuit module of claim 5 wherein the one or more circuit units are a plurality of circuit units and further comprise one or more second circuit units, a first input terminal and a second input terminal of each second circuit unit receiving the input data and the initial counting value respectively via the first input terminal and the second input terminal of the circuit module, and
wherein the control logic circuit is configured to determine whether a circuit unit among the plurality of circuit units meets a first condition in a case where all data in the first register of each circuit unit in the plurality of circuit units is different from the input data, the first condition is that the data in the corresponding second register is equal to 0.

9. The circuit module of claim 8 wherein the control logic circuit is further configured to select a circuit unit meeting the first condition from the plurality of circuit units and provide the first valid control signal and the second valid control signal respectively to the first control terminal and the second control terminal of one selected circuit unit in a case where a circuit unit meeting the first condition exists among the plurality of circuit units.

10. The circuit module of claim 8 wherein the control logic circuit is further configured to select a circuit unit from the plurality of circuit units, and provide the first valid control signal and the second valid control signal respectively to the first control terminal and the second control terminal of the selected one circuit unit and output data in the first register and the second register of the selected one circuit unit in a case where each circuit unit of the plurality of circuit units respectively does not meet the first condition, wherein the value in the second register of the selected one circuit unit is the largest among values in the second registers of all circuit units, or the value in the second register of the selected one circuit unit is the smallest among values in the second register of all circuit units, or the selected one circuit unit is randomly selected from the plurality of circuit units.

11. The circuit module of claim 5 wherein the control logic circuit is configured to provide a third valid control signal to a third control terminal of a circuit unit that meets a second condition, the second condition is that the data in corresponding first register is the same as the input data and the data in the corresponding second register is not equal to 0.

12. An apparatus for data statistics, comprising:
one or more circuit modules of claim 5, the one or more circuit modules including a first circuit module, the first input terminal and the second input terminal of the first circuit module respectively receiving parsed data and a constant value 1; and
an update circuit coupled between a last circuit module of the one or more circuit modules and a memory, and configured to update information in the memory based on a data item from a first output terminal of the last circuit module and a statistic value from a second output terminal of the last circuit module,
in a case where the one or more circuit modules are one circuit module, the first circuit module is used as the last circuit module,
in a case where the one or more circuit modules are a plurality of circuit modules, the plurality of circuit modules are connected in series such that the first input terminal and the second input terminal of each circuit module except for the first circuit module are respectively coupled to the first output terminal and the second output terminal of the previous circuit module, meanwhile, the first output terminal and the second output terminal of each circuit module except for the second circuit module are respectively coupled to the first input terminal and the second input terminal of a subsequent circuit module, the second circuit module is used as the last circuit module.

13. The apparatus according to claim 12 wherein said update circuit comprises:
an address calculator coupled between the first output terminal of the last circuit module and the memory, and configured to calculate an address of a storage location in the memory for the old statistic value of the data item based on the data item, and transmit the address to the memory; and
an adder coupled between the second output terminal of the last circuit module and the memory, and configured to obtain a new statistic value by adding an old statistic value read from the memory according to the address with the statistic value, and transmit the new statistic value to the memory.

14. The apparatus of claim 13 wherein the number of all circuit units in the one or more circuit modules is greater than or equal to m+q+c+w−1, m represents a delay from obtaining the address to starting to output the old statistic value within the memory, q represents a delay during transmitting the old statistic value from the memory to the update circuit, c represents a delay caused by the adder, and w represents a delay during transmitting the new statistic value and a write address based on the address to the memory.

15. The apparatus of claim 14 wherein the number of all circuit units of the one or more circuit modules is greater than m+q+c+w−1 in a case where the memory does not support performing both a read operation and a write operation to the same address at the same time.

16. The apparatus of claim 13 wherein the update circuit further comprises a first delay element, a second delay element, a third delay element, and a fourth delay element, the first delay element is coupled between the address calculator and the second delay element, the second delay element is coupled between the first delay element and the memory, the third delay element is coupled between the second output terminal of the last circuit module and the fourth delay element, the fourth delay element is coupled between the third delay element and the adder.

17. The apparatus according to claim 16 wherein the delay caused by each delay element in the first delay element and the fourth delay element is equal to r+m+q, r represents a delay during transmitting a read address based on the address to the memory, m represents a delay from obtaining the address to starting to output the old statistic value within the memory, and q represents a delay during transmitting the old statistic value from the memory to the update circuit.

18. The apparatus according to claim 16 wherein the delay caused by the second delay element is equal to the delay caused by the adder.

19. The apparatus according to claim 16 wherein the delay caused by the third delay element is equal to the delay caused by the address calculator.

20. The apparatus according to claim 12, further comprising:
a parser configured to parse an original data stream to obtain one or more parsed data, and to provide the one or more parsed data to the first input terminal of the first circuit module one by one.

* * * * *